US009652021B2

United States Patent
Kim (10) Patent No.: US 9,652,021 B2
(45) Date of Patent: May 16, 2017

(54) METHOD FOR CONTROLLING DYNAMIC VOLTAGE FREQUENCY SCALING IN ELECTRONIC DEVICE AND APPARATUS SUPPORTING THE SAME

(71) Applicant: Samsung Electronics Co., Ltd., Suwon-si (KR)

(72) Inventor: Minsung Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 264 days.

(21) Appl. No.: 14/468,218

(22) Filed: Aug. 25, 2014

(65) Prior Publication Data

US 2015/0058646 A1 Feb. 26, 2015

(30) Foreign Application Priority Data

Aug. 23, 2013 (KR) ........................ 10-2013-0100707

(51) Int. Cl.
*G06F 1/32* (2006.01)
*G01R 23/02* (2006.01)
*G01R 19/00* (2006.01)

(52) U.S. Cl.
CPC ....... *G06F 1/3206* (2013.01); *G01R 19/0046* (2013.01); *G01R 23/02* (2013.01); *G06F 1/3203* (2013.01); *G06F 1/324* (2013.01); *G06F 1/3243* (2013.01); *Y02B 60/1217* (2013.01); *Y02B 60/1239* (2013.01)

(58) Field of Classification Search
None
See application file for complete search history.

(56) References Cited

U.S. PATENT DOCUMENTS

| 2007/0168055 | A1* | 7/2007 | Hsu ...................... G06F 1/3203 700/32 |
| 2009/0049314 | A1 | 2/2009 | Taha et al. |
| 2011/0113269 | A1* | 5/2011 | Park ..................... G06F 1/3203 713/310 |

* cited by examiner

*Primary Examiner* — Paul Yanchus, III (57) ABSTRACT

Disclosed is an operating method of an electronic apparatus. The method includes measuring the load rate of the electronic apparatus that operates at the first driving frequency level. The method also includes determining a second driving frequency level based on the measured load rate. The method further includes determining whether or not to change the first driving frequency level into the second driving frequency level after the operational duration time of the first driving frequency level. The method includes based on determining the change from the first driving frequency level to the second driving frequency level, controlling to operate at the first driving frequency level or the second driving frequency level.

24 Claims, 6 Drawing Sheets

METHOD FOR CONTROLLING DYNAMIC VOLTAGE FREQUENCY SCALING IN ELECTRONIC DEVICE AND APPARATUS SUPPORTING THE SAME

CROSS-REFERENCE TO RELATED APPLICATION(S) AND CLAIM OF PRIORITY

The present application is related to and claims priority from and the benefit under 35 U.S.C. §119(a) of Korean Patent Application No. 10-2013-0100707, filed on Aug. 23, 2013, which is hereby incorporated by reference for all purposes as if fully set forth herein.

TECHNICAL FIELD

The present invention relates generally to a method for controlling dynamic voltage frequency scaling in an electronic device by which a duration time of a driving frequency is variably controlled, and an apparatus supporting the same.

BACKGROUND

With the development of technologies of information communication and semiconductors, portable electronic devices are widely used. In the electronic devices driven by a battery, the effective management of electric power consumption is a crucial issue.

Recently, the technology of dynamic voltage frequency scaling, by which the applied voltage and the driving frequency may be controlled according to an operation environment to thereby minimize electric power consumption, has been suggested.

SUMMARY

The above-described dynamic voltage frequency scaling refers to a method by which a function block or a processor load rate is calculated at a predetermined sampling rate defined according to the processing schedule and at least one of the driving frequency and the driving voltage is increased or decreased. Meanwhile, in the case of reducing the sampling rate for measuring a system load in the dynamic voltage frequency scaling algorithm, the cycle of the increase in the driving frequency becomes fast to thereby cause high electric power consumption. On the contrary, the increase in the sampling rate of the dynamic voltage frequency scaling algorithm may cause the degradation of the operation reactivity.

As described above, the reduction of electric power consumption conflicts with improvement of performance in the system that is applied with the dynamic voltage frequency scaling. Therefore, the method for substantially reducing electric power consumption as well as improving performance is required.

To address the above-discussed deficiencies, it is a primary object to provide a method and an apparatus for controlling dynamic voltage frequency scaling in an electronic device by which a duration time of a driving frequency at each driving frequency level is variably controlled by improving a dynamic voltage frequency algorithm for controlling the driving frequency and the dynamic voltage frequency.

In a first example, a method for controlling dynamic voltage frequency scaling in an electronic device is provided. The method includes measuring the load rate of the electronic apparatus that operates at the first driving frequency level. The method also includes determining the second driving frequency level on the basis of the measured load rate. The method further includes determining whether or not to change the first driving frequency level into the second driving frequency level after the operation duration time of the first driving frequency level expires. The method includes based on the determination of the change from the first driving frequency level to the second driving frequency level, controlling to operate at the first driving frequency level or the second driving frequency level.

In a second example, an electronic apparatus is provided. The electronic device includes an operational function monitoring unit configured to monitor a running function module and an application program and configure a delay mapping table in which each driving frequency level is mapped with a delay time. The electronic device also includes a dynamic voltage frequency scaling (DVFS) operating unit configured to measure the load rate of the electronic apparatus operating at the first driving frequency level. The DVFS operating unit is also configured to determine the second driving frequency level on the basis of the measured load rate. The DVFS is configured to determine whether or not to change the first driving frequency level into the second driving frequency level by comparing the operation duration time of the second driving frequency level with the delay time of the first driving frequency level. The DVFS is also configured to control to operate at the first driving frequency level or the second driving frequency level according to the determination of the change from the first driving frequency level to the second driving frequency level.

As described above, in a method and an apparatus for controlling a dynamic voltage frequency scaling in an electronic device, the change of the driving frequency is determined by considering a delay mapping table at each driving frequency level, so the duration time of a driving frequency, of which the electric power consumption is high compared to the performance, may be variably changed to perform an optimal operation of the terminal. In addition, a delay mapping table may be properly changed or configured according to DVFS features, application program features, and terminal features by each driving frequency level, so the driving frequency and the driving voltage may be controlled to achieve the purpose, such as various cases of use and system features, e.g., performance and electric power consumption. Further, a delay mapping table is variably changed depending on application programs, so the driving frequency may be effectively operated according to a use pattern.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 6, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device. Hereinafter, preferred embodiments of the present disclosure will be described with reference to the accompanying drawings. It is noted that, where possible, the same reference numerals are designated to the same components in the accompanying drawings. Further, detailed descriptions related to well-known functions or configurations capable of making subject matters of the present disclosure unnecessarily obscure will be omitted.

It should be understood that the embodiments described in the specification and configurations disclosed in the drawings are merely examples and do not represent all of the technical spirits of the disclosure and various modifications and variations to the disclosure and equivalents thereof can be made at the time of the disclosure.

An apparatus for controlling a dynamic voltage frequency can be applied to all electronic devices that are applied with dynamic voltage frequency scaling. The dynamic voltage control apparatus can be electronic devices or separate devices included in the electronic devices. For example, the dynamic voltage control apparatus can include a CPU, an application processor (AP), a micro-processor, an MCU, a digital signal processor (DSP), a controller, a graphic supporting device, internal logic circuits, or the like.

Figure 1:
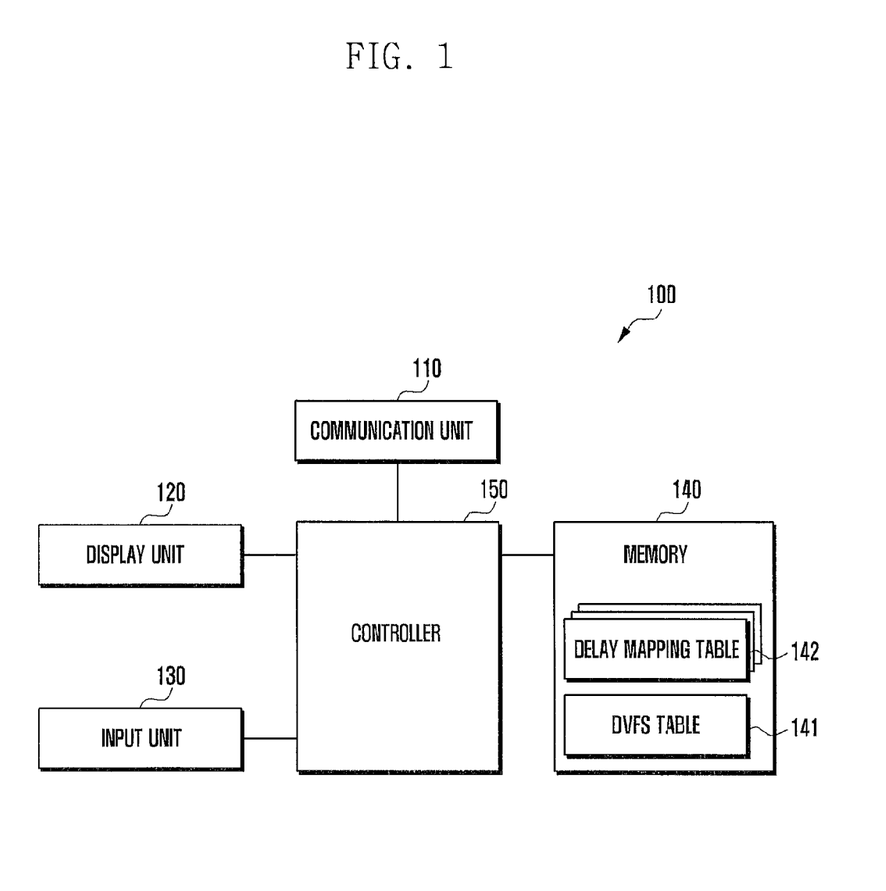
FIG. 1 is a block diagram illustrating an example configuration of an electronic apparatus supporting the dynamic voltage frequency control according to this disclosure.

FIG. 1 is a block diagram illustrating an example configuration of an electronic apparatus supporting the dynamic voltage frequency control according to this disclosure.

Referring to FIG. 1, an electronic apparatus 100 supports the operation of a terminal by determining driving conditions (such as a driving frequency and a driving voltage) of a controller according to scheduling predefined based on a dynamic voltage frequency scaling (DVFS) table. At this time, the terminal configures a delay mapping table with respect to driving frequency levels, and determines the change in the driving frequency by considering a delay time mapped with each frequency when changing the driving frequency according to a schedule, to thereby more effectively operate the controller.

In doing so, the electronic apparatus 100 includes a communication unit 110, a display unit 120, an input unit 130, a memory 140, and a controller 150.

The communication unit 110 makes communication, such as voice communication, video communication, and data communication, with available mobile communication networks through communication channels. The communication unit 110 can include an RF transmitter for transforming a transmitted signal into a high frequency band signal and amplifying the same. The communication unit 110 can also include an RF receiver for low-noise amplifying a received signal and transforming the same into a low frequency band signal. When the terminal does not support a communication function, the communication unit 110 can be omitted. The communication unit 110 can be operated by a user's request for a communication function, predetermined schedule information, or an external request. The communication unit 110 can output or receive communication signals during the operation.

Meanwhile, the controller 150 controls to support a constant voltage and a driving frequency in order to drive each function module, such as the communication unit, and the display unit of the terminal. The controller 150 can support to change the driving voltage and the driving frequency for operating the communication unit based on the DVFS table and the delay mapping table according to the operational state of the communication unit and various pieces of predefined schedule information or conditions.

The display unit 120 displays information input by or provided to a user as well as various menus of the terminal. The display unit 120 outputs various functional execution images according to the execution of operational functions under the control of the controller 150. For example, the display unit 120 can display web browser execution images, social network service execution images, game execution images, or multimedia reproduction images according to the user's selection or the predetermined schedule information. The display unit 120 is implemented by a touch screen that is comprised of a touch panel and a display panel in a layered structure, by which the display unit 120 operates as an input means.

The controller 150 supports to change the driving voltage and the driving frequency for operating the display unit 120 based on the DVFS table and the delay mapping table according to the operational state of the display unit 120 and various pieces of predefined schedule information or conditions. Meanwhile, the terminal supports a multitasking function by which various functions can be simultaneously executed. In the case of multitasking, the controller 150 supports to display an execution image with respect to a foreground task on the display unit 120. In addition, the controller 150 supports to divide the screen into pieces to simultaneously display functional execution images for two or more tasks on the display unit 120.

The input unit 130 generates various input signals for operating the terminal. The input unit 130 can include various input keys and function keys, such as side keys, shortcut keys, and a home key, for receiving an input of number or text information and configuring various functions. In addition, the input unit 130 generates key signals related to a user's setup and function control of the terminal and transfers the same to the controller 150. The controller 150 controls the corresponding functions in response to the key signals. In the case of the terminal provided with a full touch screen, the input unit 130 is provided in the form of a virtual touch, pad.

The memory 140 stores at least one application program necessary for the operation of the terminal, user data created by the user, messages transmitted to and received from networks, and data resulting from the execution of applications. The memory 140 includes a program area and a data area. The program area can store an operating system (OS) for booting the terminal and operating elements set forth above, application programs that are installed or downloaded, a DVFS algorithm, and the like. The data area stores data generated by using the terminal.

The memory 140 includes a DVFS table 141 and a delay mapping table 142.

The DVFS table 141 is aimed at configuring driving conditions defined to drive the controller according to the operation state of the terminal. The DVFS table 141 includes information that is defined to change at least one of the driving frequency and the driving voltage according to the change in the amount of calculation or an operational load rate of the controller. Meanwhile, a basic DVFS table can be configured according to function modules of the terminal or the change in the amount of calculation of application programs, but the DVFS table is not limited thereto. Alternatively, a plurality of DVFS tables can be provided to each function module or application program.

The delay mapping table 142 is a table in which a specific delay time is paired with each driving frequency level defined in the DVFS table 141 in order for flexible change in duration time of each driving frequency. A plurality of delay mapping tables 142 can be configured depending on each function module or application program executed in the terminal. The delay mapping table 142 can be a lookup table including a plurality of frequencies and delay times related to at least one of the plurality of frequencies.

For example, in the case of the execution of a web browsing function, the controller 150 controls to apply the delay mapping table 142 that is optimized for the web browsing function, and in the case of the execution of a game function, the controller 150 controls to apply the delay mapping table 142 that is optimized for the game function.

The terminal differently applies the optimized delay mapping table 142 according to function modules or operational functions (such as application programs).

The controller 150 controls overall operations of the terminal and signal flows between internal elements thereof and processes data. The controller 150 controls the power supply from a battery to the internal elements. With the electric power supplied, the controller 150 controls a booting process of the terminal and executes various application programs stored in the program area in order to execute functions of the terminal according to the user's setup.

The controller 150 computes optimal driving conditions based on the DVFS table and the delay mapping tables according to the operation state of the terminal and operates the terminal on the basis of the computed driving conditions, to thereby support the flexible change of at least one of the driving frequency and the driving voltage, which are required for the operation of the terminal.

Hereinafter, the operation of the controller 150 will be described in more detail with reference to FIG. 2.

Meanwhile, the terminal can further include a power supply unit for supply electric power required for the operation of the terminal, an audio processor, and a camera module as well as the above-described elements. The power supply unit provides electric power of a constant voltage to each element of the terminal under the control of the controller.

Figure 2:
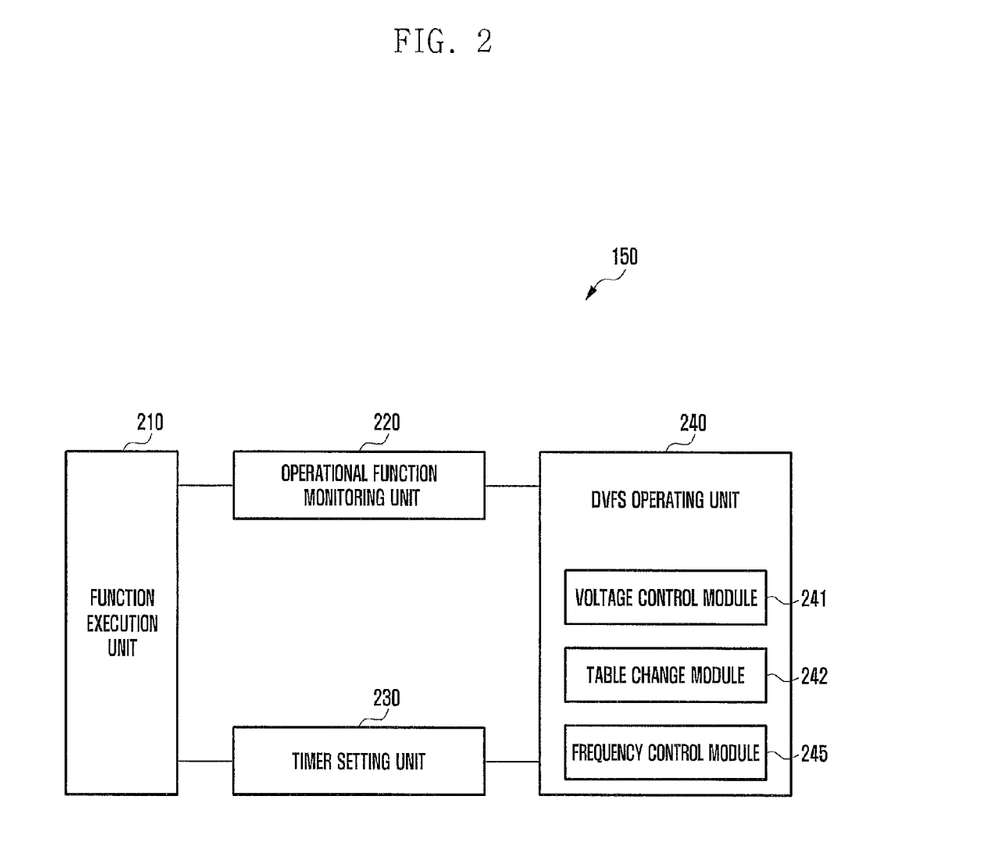
FIG. 2 is a block diagram illustrating an example detailed configuration of a controller in an electronic apparatus according to this disclosure.

FIG. 2 is a block diagram illustrating an example detailed configuration of a controller 150 in an electronic apparatus 100 according to this disclosure.

Referring to FIG. 2, the controller 150 includes a function execution unit 210, an operational function monitoring unit 220, a timer setting unit 230, and a DVFS operating unit 240.

The function execution unit 210 executes function modules or application programs according to the operation of the terminal by a user's input or a predefined schedule. The function modules or the application programs are operated at a specific driving frequency by using electric power of a constant voltage predefined according to a design, and they include at least one of a hardware block that has various physical devices for supporting functions and a software block that is embedded or retrieved from the memory. At least one of a specific voltage and a specific driving frequency is determined by the DVFS operating unit 240 when the function module or the application program is executed, the function execution unit 210 supports the supply of electric power and the distribution of signals according to the determination.

The operational function monitoring unit 220 verifies the function module or the application program operated by the function execution unit and monitors the uppermost (such as foreground) operational function according to a predetermined schedule.

In addition, the operational function monitoring unit 220 classifies operational functions into a plurality of job groups depending on operational features by the execution of functions and configures the delay mapping table by each job group. For example, the operational function monitoring unit 220 classifies operational functions into four job groups as follows.

TABLE 1

| Driving Frequency Level (MHz) | Delay Time (millisecond) |
| --- | --- |
| 200-600 | 20 |
| 700-900 | 20 |
| 1000-1100 | 80 |
| 1200-1600 | 100 |
| 1700-1900 | 20 |

TABLE 2

| Driving Frequency Level (MHz) | Delay Time (millisecond) |
| --- | --- |
| 200-600 | 20 |
| 700-1100 | 100 |
| 1200-1600 | 400 |
| 1700-1900 | 20 |

TABLE 3

| Driving Frequency Level (MHz) | Delay Time (millisecond) |
|---|---|
| 200-600 | 20 |
| 700-900 | 20 |
| 1000-1100 | 140 |
| 1200-1600 | 500 |
| 1700-1900 | 20 |

TABLE 4

| Driving Frequency Level (MHz) | Delay Time (millisecond) |
|---|---|
| 200-600 | 20 |
| 700-900 | 20 |
| 1000-1200 | 140 |
| 1300-1600 | 400 |
| 1700-1900 | 20 |

Here, Table 1 is an example of a basic delay mapping table, and Table 2 is an example of a delay mapping table that has been changed to be optimized for the web browsing function. Further, Table 3 is an example of a delay mapping table that has been changed to be optimized for the social network service function, and Table 4 is an example of a delay mapping table that has been changed to be optimized for the game and multimedia execution function.

The above delay mapping tables are not limited to the above tables, and it can be provided according to various function modules or application programs. The delay time to the driving frequency level can be variably configured according to features of each function module or application program as well. That is, the above-described delay mapping tables can vary with the kinds, the number, and the configuration states of function modules and application programs, which are on activation during the operation of the terminal.

The operational function monitoring unit 220 configures the basic delay mapping table of Table 1 as a default of the DVFS algorithm. The operational function monitoring unit monitors the uppermost operational function, and if the operational function of a foreground is changed, configures to change the basic delay mapping table into another delay mapping table corresponding to the changed operational function.

Specifically, the operational function monitoring unit 220 transfers the basic delay mapping table corresponding to Table 1 to the DVFS operating unit 240 upon the supply of electric power to the terminal, and monitors whether the uppermost operational function has been changed. Here, the uppermost operational function includes at least one of a function output on the foreground screen or an operational function of the highest priority. When the uppermost operational function has been changed, the operational function monitoring unit 220 determines a job group corresponding to the uppermost operational function. The operational function monitoring unit 220 obtains the delay mapping table 142 that is optimized for the job group from the memory and transfers the same to the DVFS operating unit 240.

The timer setting unit 230 sets or configures a sampling rate or a monitoring time in the DVFS algorithm. The timer setting unit 230 initializes the timer or sets the sampling rate according to signals generated in the operational function monitoring unit 220 and the DVFS operating unit 240.

The DVFS operating unit 240 verifies a running operational function and calculates a load rate or the amount of calculation of the controller through measurement according to a predetermined schedule, such as by every sampling rate. The DVFS operating unit 240 determines at least one of operational conditions, such as the driving frequency and the driving voltage of an operation state with reference to the DVFS table according to the calculated load rate. Particularly, when the driving frequency is required to be changed, the DVFS operating unit 240 determines the change in the driving frequency on the basis of the delay time for the current driving frequency in the delay mapping table.

In order to do so, the DVFS operating unit 240 includes at least one of a voltage control module 241, a table change module 242, and a frequency control module 245.

The voltage control module 241 controls to supply electric power of a level determined based on the DVFS table 141. The table change module 242 controls to change the delay mapping table 142 that is configured in the DVFS algorithm to correspond to the uppermost operational function. When the delay mapping table 142 is transferred from the operational function monitoring unit 220, the table change module controls to allow the table to be set according to the transferred delay mapping table 142.

The frequency control module 245 controls the driving frequency to be supplied to the controller 150. The frequency control module 245 selects the driving frequency level according to the operational load rate of the controller on the basis of the DVFS table 141 and compares the duration time of the current driving frequency with the delay time corresponding to the current driving frequency by using the delay mapping table 142. As a result of the comparison, if the duration time of the current driving frequency is less than the delay time, the frequency control module 245 controls not to change the driving frequency. Otherwise, if the duration time of the current driving frequency is greater than the delay time, the frequency control module 245 controls the apparatus to operate at the changed driving frequency.

The above-described electric power control and frequency control is performed based on the DVFS table and the delay mapping table. In this case, the delay mapping table is changed depending on the uppermost operational function, and either the voltage or the frequency is controlled to be changed according to the operational function.

Figure 3:
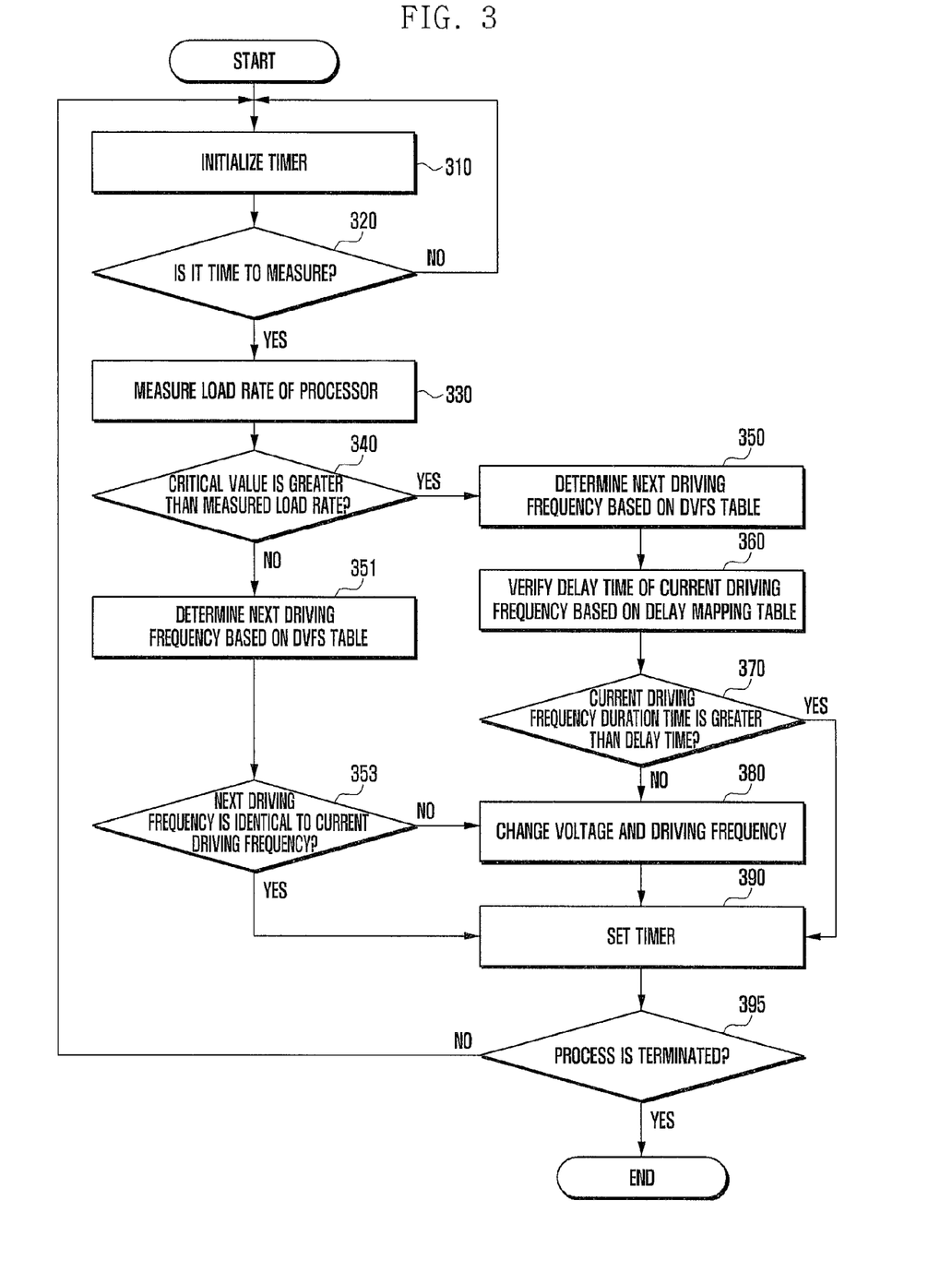
FIG. 3 is a flowchart illustrating an example method for controlling dynamic voltage frequency scaling according to this disclosure.

FIG. 3 is a flowchart illustrating an example method for controlling a dynamic voltage frequency according to this disclosure.

Referring to FIG. 3, the electronic apparatus supports the operation of the terminal on the basis of a predefined constant driving frequency and electric power. For example, the electronic apparatus performs a booting operation or supports a sleep state and an active state of the terminal by using the predefined constant driving frequency and electric power. Hereinafter, the controller (such as controller 150) of the electronic apparatus will be referred to as a control apparatus.

When an operational function is executed according to an input event or predefined schedule information, the control apparatus initializes a clock operation timer with respect to the operational function in operation 310.

Meanwhile, if the control apparatus includes two or more cores rather than a single processor, the uppermost operational function is a foreground function or a function of the highest priority according to a predefined priority.

In operation 320, the control apparatus determines whether it is time to measure an operational load rate of the control apparatus (such as a CPU) according to a predefined schedule. Here, the load rate of the control apparatus can be the amount of calculation or the load rate resulting from the execution of the uppermost operational function.

In operation 330, if it is time to measure the operational load rate, the operational load rate of the control apparatus is measured to obtain the amount of change in the load rate. Otherwise, if it is not yet time to measure the operational load rate, the control apparatus returns to operation 310.

In operation 340, the control apparatus determines whether the measured load rate is greater than a predefined critical value. If the measured load rate is greater than the critical value, the control apparatus determines the next driving frequency, based on the DVFS table in operation 350. In this case, since the load rate is greater than the critical value, the next driving frequency level can be determined to be higher than the current driving frequency level. In the case of the load rate less than the critical value, the control apparatus can determine that the next driving frequency level is equal to or less than the current driving frequency level.

In operation 360, the control apparatus identifies the delay time that is mapped with the current driving frequency by applying the delay mapping table. At this time, the delay mapping table that is optimized for the uppermost operational function is be applied. For example, when the web browsing function is identified as the uppermost operational function, the control apparatus changes the current delay mapping table in the DVFS algorithm into the delay mapping table that is optimized for the web browsing function.

In operation 370, the control apparatus compares the operational duration time at the current driving frequency with the delay time to determine whether the operational duration time of the current driving frequency is greater than the delay time of delay mapping table. If the operational duration time of the delay mapping table is greater than the delay time, the control apparatus changes at least one of the driving frequency and the driving voltage of the determined frequency level in operation 380. The control apparatus supports the proper supply of electric power and a frequency which are required for the operation of the terminal by changing at least one of the voltages and the driving frequency.

On the contrary, if the operational duration time of the current driving frequency is less than the delay time, the control apparatus sets the timer for the next schedule to thereby operate the terminal with the current driving frequency without changing the driving frequency in operation 390.

For example, if the current driving frequency is 1.1 GHz and the driving frequency is required to be changed to 1.3 GHz according to the DVFS table, the control apparatus identifies the delay time of 60 ms with respect to the frequency of 1.1 GHz from the delay mapping table.

At this time, if the operational duration time of the control apparatus at the frequency of 1.1 GHz is greater than 60 ms, the control apparatus changes the driving frequency to 1.3 GHz. Otherwise, if the operational duration time of the control apparatus at the frequency of 1.1 GHz is less than 60 ms, the control apparatus may not change the driving frequency but maintain the driving frequency of 1.1 GHz until the duration time exceeds 60 ms.

Meanwhile, if the measured load rate is less than the predefined critical value, the control apparatus determines the next driving frequency on the basis of the DVFS table in operation 351. In this case, since the load rate is less than the critical value, the next driving frequency level is determined to be equal to or less than the current driving frequency level. Next, if the next driving frequency level is equal to the current driving frequency level through the determination in operation 353, the control apparatus proceeds to operation 390 to thereby set the timer for the next scheduling. If the next driving frequency level is different from the current driving frequency level, such as if the next driving frequency level is less than the current driving frequency level, the control apparatus proceeds to operation 380 to thereby change at least one of the driving frequency and the driving voltage of the determined level.

In operation 395, the control apparatus verifies whether the operational function is terminated, and if the operational function is not terminated, the control apparatus returns to operation 310 to repeat the operations.

Figure 4:
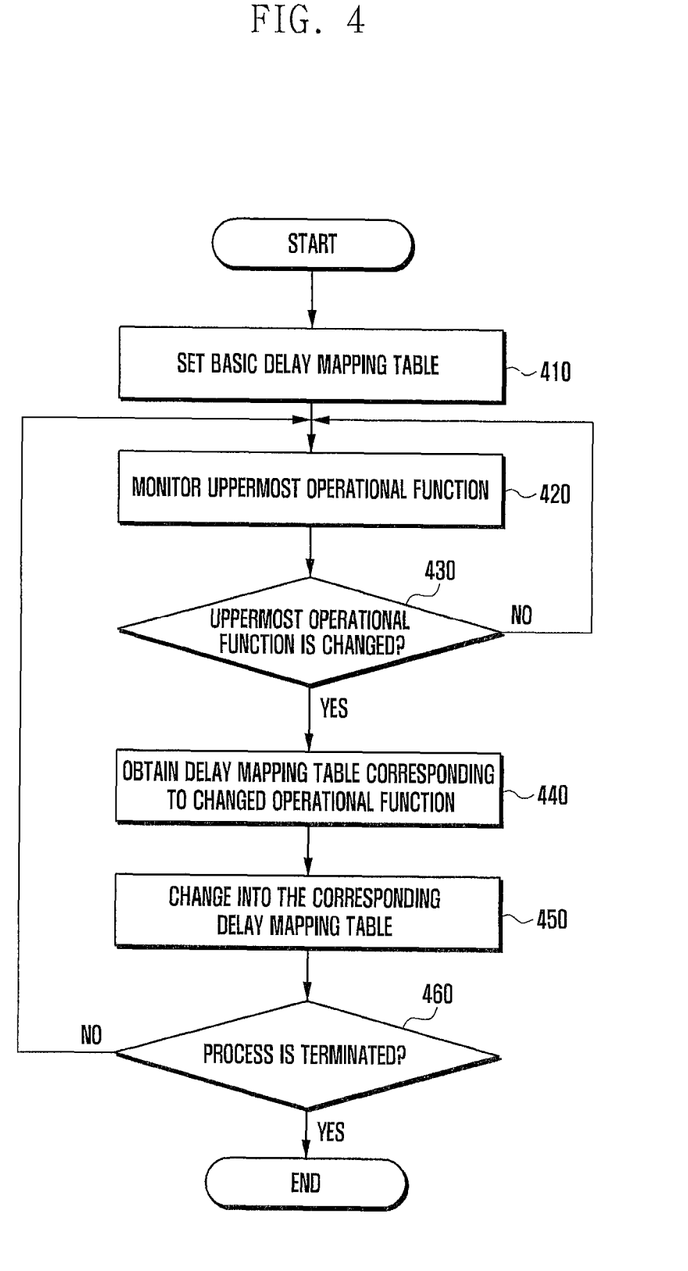
FIG. 4 is a flowchart illustrating an example method of monitoring an operational function according to this disclosure.

FIG. 4 is a flowchart illustrating an example method of monitoring an operational function according to this disclosure.

Referring to FIG. 4, in operation 410, the control apparatus sets the delay mapping table in the DVFS algorithm. The initially set delay mapping table in the DVFS algorithm can be the basic delay mapping table of Table 1 set forth in FIG. 2, but it is not limited thereto, and the delay mapping table that is optimized for a specific operational function can be set.

In operation 420, the control apparatus monitors the uppermost operational function according to a predetermined schedule. For example, the control apparatus monitors at least one of the function displayed on the foreground screen or the operational function of the highest priority. Meanwhile, in the case of the control apparatus adopting two or more cores, the control apparatus monitors the function displayed on the foreground screen as the uppermost operational function.

In operation 430, the control apparatus determines whether the uppermost operational function has been changed. If the uppermost operational function has been changed, the control apparatus obtains the delay mapping table that is optimized to correspond to the changed operational function from the memory in operation 440. On the contrary, if the uppermost operational function has not been changed, the control apparatus returns to operation 420.

In operation 450, the control apparatus replaces the current delay mapping table with the obtained delay mapping table in the DVFS algorithm. That is, the control apparatus continuously monitors the uppermost operational function, and if the uppermost operational function is changed, replaces the current delay mapping table with the delay mapping table optimized for the corresponding operational function. Therefore, the DVFS function is flexibly changed by each function module or application program, to thereby support an effective operation.

Next, in operation 460, the control apparatus determines the termination of the operation, and if it is not terminated, the control apparatus returns to operation 420 to periodically or continuously monitor the uppermost operational function.

As described above, the control apparatus verifies the function modules or application programs and supports the change of the driving frequency on the basis of the delay mapping tables configured according to each function module or application program for the DVFS-based driving frequency control.

Figure 5:
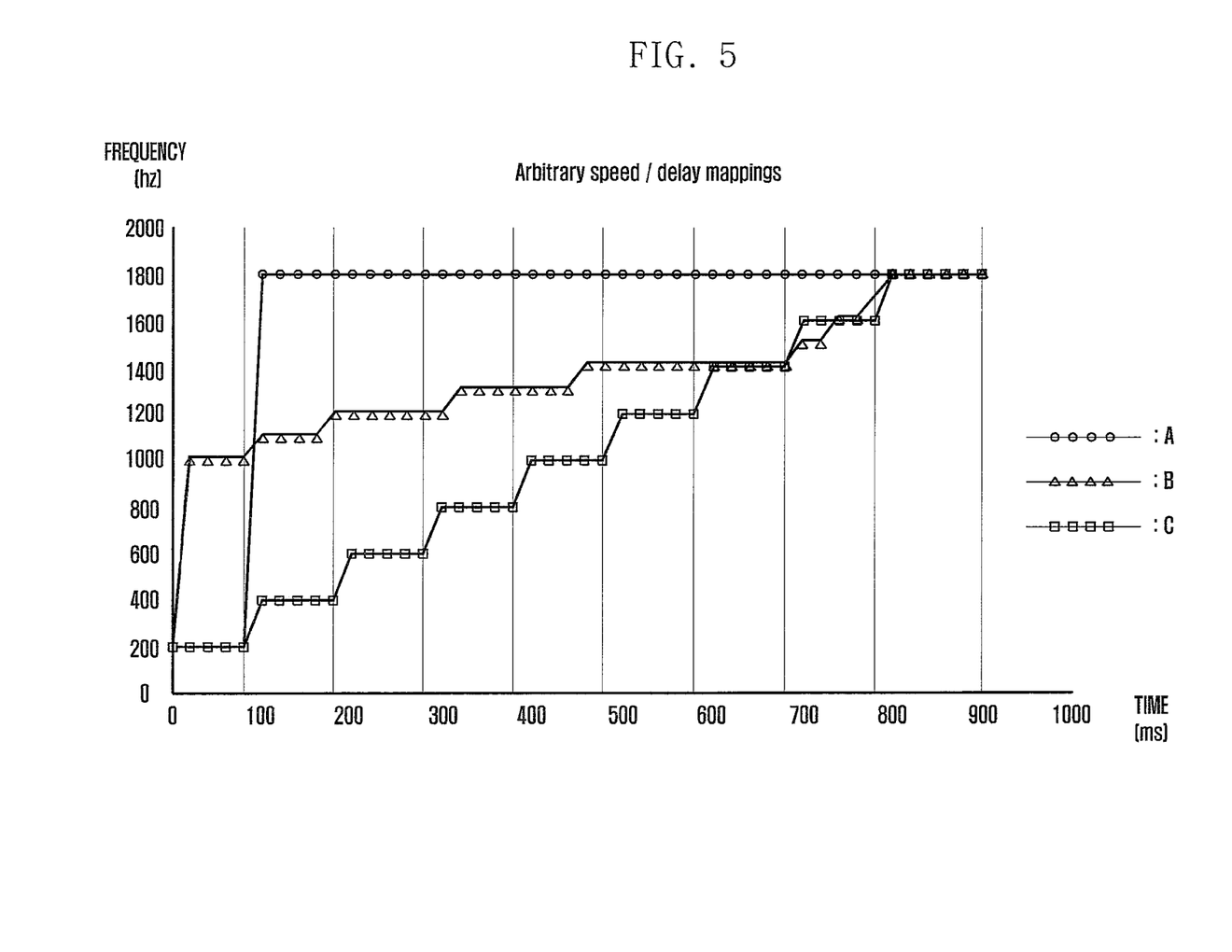
FIG. 5 illustrates an example comparison of the dynamic voltage frequency control effect according to this disclosure.

FIG. 5 illustrates an example comparison of the dynamic voltage frequency control effect according to this disclosure.

Referring to FIG. 5, the change in the driving frequency is illustrated depending on time. "A" and "C" in the legend show the change in the driving frequency in the case of applying the general DVFS table, and "B" shows the change in the driving frequency in the case of applying the delay mapping table as well as the DVFS table. It is assumed that a maximum CPU frequency is 1.8 GHz and a CPU load rate is 100 in the present embodiment.

First, each sampling rate of "A" and "C" which are applied with the general DVFS table is 100 ms. "A" shows the example in which the frequency is changed to the maximum value when measuring at 100 ms, because the CPU load rate exceeds the maximum critical value. Conversely, "C" shows the example in which the frequency is changed to the upper driving frequency level at every 100 ms, because the CPU load rate exceeds a constant critical value. In the case of "C", the driving frequency is gradually changed every sampling rate, and finally reaches the maximum driving frequency in 800 ms of eight cycles. In this case, each driving frequency level has a constant operational duration time.

On the contrary, referring to "B" that is applied with the DVFS table together with the delay mapping table, the duration time of the driving frequency varies with levels. The driving frequency is changed by comparing the delay time of the delay mapping table with the duration time of the current frequency. That is, the driving frequency is changed as if the sampling rate is flexibly changed.

For example, it is given that the delay mapping table applied to "B" is the following table, and the sampling rate of "B" is 20 ms.

TABLE 5

| | Driving Frequency Level | Delay Time |
|---|---|---|
| Section 1 | 200~900 MHz | 20 msec |
| Section 2 | 1.0~1.1 GHz | 80 msec |
| Section 3 | 1.2~1.3 GHz | 140 msec |
| Section 4 | 1.4 GHz | 240 msec |
| Section 5 | 1.5~1.60 Hz | 40 msec |
| Section 6 | 1.7 GHz~ | 20 msec |

It can be understood that the terminal calculates a CPU load rate at every 20 ms and the driving frequency is changed by considering the delay time of the delay mapping table. More specifically, although the CPU load rate in section 2 exceeds the critical value, since the delay time at the frequency level of 1.1-1.1 GHz is 80 ms, the driving frequency may not be changed during the delay time of 80 ms. When the delay time of 80 ms expires, the driving frequency is changed to the next level, such as section 3. Likewise, although the CPU load rate of section 3 exceeds the critical value as well, since the delay time at the frequency level of 1.2-1.3 GHz is 140 ms, the terminal operates with the driving frequency of 1.2-1.3 GHz for 140 ms. Then, when the delay time of 140 ms expires, the driving frequency is be changed to the next level, such as section 4.

As illustrated in the drawing, in "B", the change of the driving frequency is variably controlled based on the delay mapping table so that the operation is maintained for the delay time at each driving frequency level, and then the driving frequency is changed to the next driving frequency level.

For example, in order to improve performance of the terminal and reduce electric power consumption, it is preferable to change the driving frequency into a driving frequency level of high efficiency, such as the driving frequency level at which the ratio of electric power consumption to the performance is high. However, in the case of "C" that is measured in a specific cycle, the CPU load rate is calculated at predetermined time interval. Therefore, since the operational duration times of the driving frequency allotted to each level are identical to each other in "C", it may not properly reflect the operation environment of the terminal.

Comparing "B" with "C", the time taken to reach the maximum driving frequency in "B" and "C" is the same, such as 800 ms, but the times allotted to each driving frequency level are equal to each other in "B", and contrarily, the times allotted to each driving frequency level are different from each other in "C". That is, the degradation of performance is minimized and electric power consumption is reduced by increasing the operating section of the driving frequency that has a high efficiency with respect to each operational function.

Figure 6:
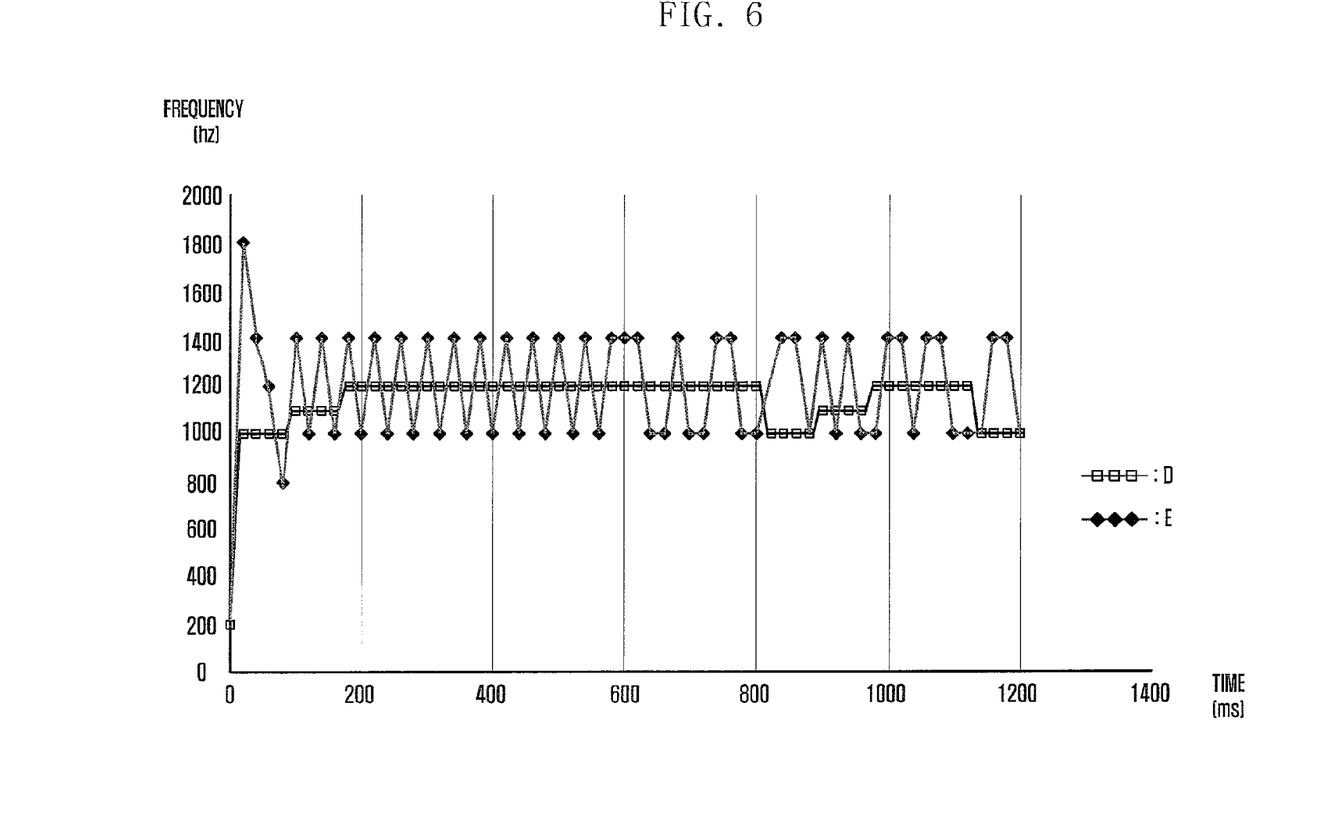
FIG. 6 illustrates an example comparison of the dynamic voltage frequency control effect according to this disclosure.

FIG. 6 illustrates an example comparison of the dynamic voltage frequency control effect according to this disclosure.

FIG. 6 shows the change in the driving frequency depending on time, wherein "E" refers to the change in the driving frequency by applying the general DVFS table, and "D" refers to the change in the driving frequency by applying the delay mapping table as well as the DVFS table. In an embodiment, it can be assumed that the maximum CPU frequency is 1.8 GHz and the CPU load rate is changed at the approximate value to the critical value, as in FIG. 5. In addition, the delay mapping table applied to "D" corresponds to Table 5 that is applied to "B" of FIG. 5, and the sampling rate of "D" is the same, such as 20 ms as that of FIG. 5, so a detailed description thereof will be omitted.

First, the sampling rate of "E" that is applied with the general DVFS table is 20 ms. Referring to "E", the CPU load rate exceeds the predefined critical value at every 20 ms, so the driving frequency is frequently changed. The frequent change of the driving frequency as shown in "E" causes the degradation of performance, particularly in network communication that requires an operation of a consistent frequency.

On the contrary, when the driving frequency is changed by applying the DVFS table together with the delay mapping table, although the CPU load rate exceeds the critical value, the driving frequency may not be changed for the delay time at each driving frequency level, so this gives the same operational effect as that of "D". In an embodiment, a fluctuation issue resulting from the frequent change of the driving frequency is overcome.

Meanwhile, the method and the apparatus for controlling a dynamic voltage frequency scaling can be implemented in the form of a program that can be performed by various computing means and recorded in a computer-readable recording medium. The computer-readable recording medium can include a program command, a data file, and a data structure alone or a combination thereof. The program command recorded in the recording medium can be things specially designed and configured in accordance with this disclosure, or things that are well known to and can be used by those skilled in the computer software related art.

The computer-readable recording medium includes magnetic media such as hard disks, floppy disks and magnetic tapes, optical media such as a Compact Disc Read-Only Memory (CD-ROM) and a Digital Versatile Disc (DVD), magneto-optical media such as floptical disks, and hardware devices such as a Read-Only Memory (ROM), a Random Access Memory (RAM) and a flash memory, which are specially configured to store and perform program commands. Further, the program command includes a machine language code generated by a compiler and a high-level language code executable by a computer through an interpreter and the like. The hardware devices can be configured to operate as one or more software modules to perform the operations described herein.

Although the present disclosure has been described with an exemplary embodiment, various changes and modifications can be suggested to one skilled in the art. It is intended that the present disclosure encompass such changes and modifications as fall within the scope of the appended claims.

What is claimed is:

1. An operating method of an electronic apparatus, the method comprising:
   measuring a load rate of the electronic apparatus that operates at a first driving frequency level;
   determining a second driving frequency level based on the measured load rate;
   determining, based on a dynamic voltage frequency scaling (DVFS) table for controlling a driving voltage and the driving frequency and a delay mapping table in which a delay time is mapped with each driving frequency, whether or not to change the first driving frequency level into the second driving frequency level after an operational duration time of the first driving frequency level; and
   based on the determination of the change from the first driving frequency level to the second driving frequency level, controlling to operate at the first driving frequency level or the second driving frequency level.

2. The method of claim 1, wherein determining whether or not to change from the first driving frequency level into the second driving frequency level comprises:
   if the operational duration time of the first driving frequency level is greater than the delay time that is mapped with the first driving frequency level, determining to operate at the second driving frequency level; and
   if the operational duration time of the first driving frequency level is less than the delay time that is mapped with the first driving frequency level, determining to maintain the operation at the first driving frequency level.

3. The method of claim 1, wherein at least one of the delay mapping tables, in which each driving frequency level is mapped with the delay time, is configured according to each function module or application program.

4. The method of claim 1, wherein each defined driving frequency level is defined with a specific delay time in the delay mapping table.

5. The method of claim 1, wherein, measuring the load rate includes measuring the load rate resulting from an execution of an uppermost operational function.

6. The method of claim 1, wherein measuring the load rate includes measuring the load rate in a predetermined cycle.

7. The method of claim 1, wherein determining the second driving frequency level comprises:
   if the load rate of the electronic apparatus is greater than a predetermined critical value, determining the second driving frequency level to be higher than the first driving frequency level; and
   if the load rate of the electronic apparatus is less than the predetermined critical value, determining the second driving frequency level to be equal to or less than the first driving frequency level.

8. The method of claim 5, wherein the uppermost operational function includes a foreground application program or a function module.

9. The method of claim 5, further comprising:
   monitoring the uppermost operational function; and
   if the uppermost operational function is changed as a result of the monitoring, changing a current delay mapping table to a delay mapping table corresponding to the uppermost operational function.

10. An electronic apparatus comprising:
    an operational function monitoring unit configured to monitor a running function module and an application program and configure a delay mapping table in which each driving frequency level is mapped with a delay time; and
    a dynamic voltage frequency scaling (DVFS) operating unit configured to measure a load rate of the electronic apparatus operating at a first driving frequency level, determine a second driving frequency level based on the measured load rate, determine whether or not to change the first driving frequency level into the second driving frequency level by comparing an operational duration time of the second driving frequency level with the delay time mapped with the first driving frequency level, and control to operate at the first driving frequency level or the second driving frequency level according to the determination of the change from the first driving frequency level to the second driving frequency level.

11. The electronic apparatus of claim 10, wherein the DVFS operating unit is configured to:
    if the operation duration time of the first driving frequency level is greater than the delay time that is mapped with the first driving frequency level, determine to operate at the second driving frequency level, or
    if the operational duration time of the first driving frequency level is less than the delay time that is mapped with the first driving frequency level, determine to maintain the operation at the first driving frequency level.

12. The electronic apparatus of claim 10, wherein the operational function monitoring unit is configured to configure a plurality of delay mapping tables for controlling a frequency according to each function module or application program and monitor an uppermost operational function to change a current delay mapping table into a delay mapping table configured with the uppermost operational function.

13. The electronic apparatus of claim 10, wherein the uppermost operational function includes a foreground application program or a function module.

14. The electronic apparatus of claim 10, further comprising a memory configured to store a DVFS table for controlling a driving voltage and the driving frequency and at least one delay mapping table corresponding to each function module or application program.

15. The electronic apparatus of claim 10, wherein the DVFS operating unit is configured to measure a load rate in a predetermined cycle and determine the second driving frequency based on a predetermined critical value.

16. The electronic apparatus of claim 10, wherein the DVFS operating unit is configured to:
    if the load rate of the apparatus is greater than a predetermined critical value, determine the second driving frequency level to be higher than the first driving frequency level, and
    if the load rate of the apparatus is less than the predetermined critical value, determine the second driving frequency level to be equal to or less than the first driving frequency level.

17. An electronic apparatus comprising:
- a memory configured to store a table including at least one delay time, wherein each delay time among the at least one delay time is mapped to a driving frequency of the electronic apparatus;
- a controller including at least one operation mode; and
- an operational function monitoring unit configured to monitor an operation state of the electronic apparatus, wherein the operational function monitoring unit is configured to determine the operation mode of the controller according to a delay mapping table of the memory and a result of the monitoring.

18. An operating method of an electronic apparatus, the method comprising:
- monitoring an amount of calculations of a processor in the electronic apparatus;
- changing a driving frequency of the processor, based at least on the monitored amount of calculations; and
- maintaining the changed frequency for at least a related delay time, wherein the related delay time is related to the changed driving frequency based on a delay mapping table in which a delay time is mapped with each driving frequency, the delay mapping table stored in the electronic apparatus.

19. The method of claim 18, further comprising selecting the related delay time based at least on the changed frequency.

20. The method of claim 19, wherein selecting the related delay time comprises using a lookup table including a plurality of frequencies and delay times related to at least one of the plurality of frequencies.

21. The method of claim 18, wherein changing the driving frequency of the processor comprises selecting the driving frequency based on at least one of software programs executed in the electronic apparatus or modes of the electronic apparatus.

22. The method of claim 18, wherein changing the driving frequency of the processor comprises using a lookup table selected based on at least one of software programs executed in the electronic apparatus or modes of the electronic apparatus, wherein the lookup table includes a plurality of frequencies and delay times related to at least one of the plurality of frequencies.

23. An electronic apparatus comprising:
- a processor; and
- a memory configured to at least temporarily store at least part of an operating system executed by the processor,
- wherein the processor, by executing at least part of the operating system, is configured to monitor an amount of calculation of the processor, change a driving frequency of the processor based at least in part on the monitored amount of calculation, and maintain the changed frequency for at least a delay time related to the changed driving frequency based on a delay mapping table in which a delay time is mapped with each driving frequency, the delay mapping table stored in the electronic apparatus.

24. The electronic apparatus of claim 10, wherein:
- the DVFS operating unit is further configured to measure the load rate by measuring the load rate resulting from an execution of an uppermost operational function;
- the operational function monitoring unit is further configured to monitor the uppermost operational function; and
- the DVFS operating unit is further configured to: if the uppermost operational function is changed as a result of the monitoring, change a current delay mapping table to a delay mapping table corresponding to the uppermost operational function.

* * * * *